United States Patent [19]

Yamazaki

[11] Patent Number: 5,283,465
[45] Date of Patent: Feb. 1, 1994

[54] SUPERCONDUCTING LEAD ON INTEGRATED CIRCUIT

[75] Inventor: Shunpei Yamazaki, Tokyo, Japan

[73] Assignee: Semiconductor Energy Laboratory Co., Ltd., Kanagawa, Japan

[21] Appl. No.: 751,573

[22] Filed: Aug. 22, 1991

Related U.S. Application Data

[63] Continuation of Ser. No. 230,992, Aug. 11, 1988, abandoned.

[30] Foreign Application Priority Data

| Aug. 13, 1987 | [JP] | Japan | 62-202142 |
| Aug. 13, 1987 | [JP] | Japan | 62-202143 |
| Aug. 13, 1987 | [JP] | Japan | 62-202144 |
| Aug. 13, 1987 | [JP] | Japan | 62-202145 |

[51] Int. Cl.$^5$ ............... H01L 39/00; H01L 23/48; H01B 12/00
[52] U.S. Cl. ............... 257/663; 257/754; 257/762; 505/1; 505/700; 505/703; 505/704
[58] Field of Search ............... 357/5, 71 S; 505/700, 505/704, 1, 703; 257/663, 762, 754

[56] References Cited

U.S. PATENT DOCUMENTS

| 4,660,061 | 4/1987 | Sweeny et al. | 357/5 |
| 4,673,968 | 6/1987 | Hieber et al. | 357/71 S |
| 4,707,723 | 11/1987 | Okamoto et al. | 357/71 S |
| 4,837,609 | 6/1989 | Gurvitch et al. | 357/71 |
| 4,916,508 | 4/1990 | Tsukamoto et al. | 357/71 |
| 4,952,554 | 8/1990 | Jin et al. | 505/1 |

FOREIGN PATENT DOCUMENTS

| 0295708 | 12/1988 | European Pat. Off. | |
| 0299163 | 1/1989 | European Pat. Off. | |
| 60-88483 | 5/1985 | Japan | 357/5 |
| 61-110480 | 5/1986 | Japan | |

OTHER PUBLICATIONS

Appl. Phys. Lett. 51(3), Jul. 20, 1987, "High $T_c$ superconductors-composite wire fabrication", by Jin et al., pp. 203, 204.

Japanese Journal of Applied Physics, vol. 26, No. 5, May, 1987, pp. L759–L760, "Critical Temperature and Critical Current Density of La–Sr–Cu–oxide Wires" by Kohno et al.

*Primary Examiner*—William Mintel
*Assistant Examiner*—Steven Loke
*Attorney, Agent, or Firm*—Sixbey, Friedman, Leedom & Ferguson

[57] ABSTRACT

An improved electric device utilizing a superconducting material. In order to avoid undesirable oxidation during firing of a ceramic to be superconducting material formed on the substrate, the superconducting material is provided only on the position in which the superconducting material does not contact the operational region of said semiconductor substrate.

4 Claims, 5 Drawing Sheets

SUPERCONDUCTING LEAD ON INTEGRATED CIRCUIT

This application is a continuation of Ser. No. 07/230,992, filed Aug. 11, 1988, now abandoned.

BACKGROUND OF THE INVENTION

This invention relates to superconducting devices and manufacturing methods for same.

Along with efforts to make integrated circuits more dense, high operational speeds are required. The fine structures of electric circuits give rise to problems of decrease in operational speed and in reliability at exothermic parts of integrated circuits. Because of this, if semiconductor devices are driven at the liquid nitrogen temperature, the mobilities of electron and hole become 3-4 times as faster as those at room temperature and as a result the frequency characteristics can be improved.

An attempt to make use of superconductors for semiconductor devices is described in Japanese Patent Application No.sho62-053724 filed on Mar. 9, 1987 in the name of the assignee of this application. In that application, it has been proposed to make lead lines utilizing superconducting ceramic materials. The superconducting ceramics have to be fired for a long time period in an oxidizing atmosphere after applied on the semiconductor substrate in place. Because of this, some surface portion of the semiconductor tends to be oxidized and form insulating oxide films. For example, in case of silicon semiconductor devices, silicon oxide is formed adjacent to their superconducting electrodes.

SUMMARY OF THE INVENTION

It is therefore an object of the invention to provide a superconducting device which is free from degradation originating from the oxidation of the portion contacting a superconducting ceramic or other adverse influence of superconducting material.

It is another object of the present invention to provide a method of manufacturing superconducting devices without adverse influence on the performance of the devices originating from the firing of superconducting ceramics of other adverse influence of superconducting material.

DETAILED DESCRIPTION OF THE PREFERRED EMBODIMENTS

Figure 1:
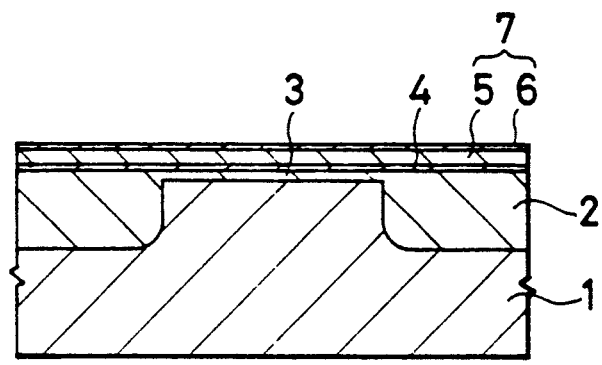
FIGS. 1(A) to 1(D) are cross sectional views showing the manufacturing method of a superconducting device in accordance with the present invention.
Figure 1:
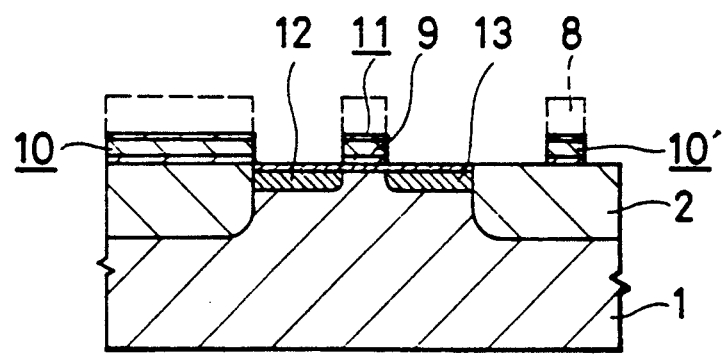
Figure 1:
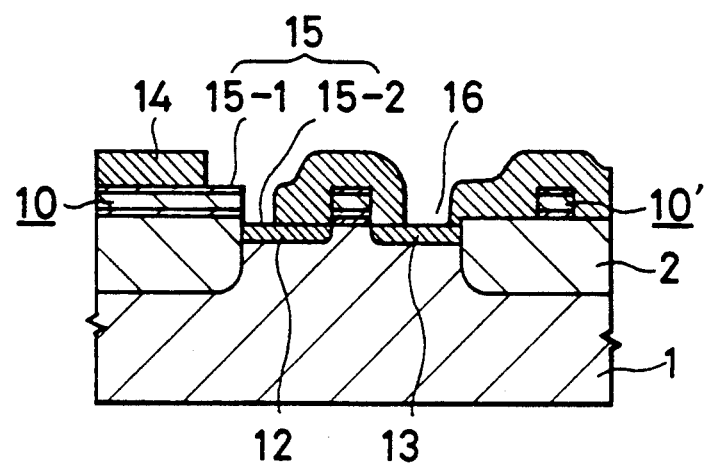
Figure 1:
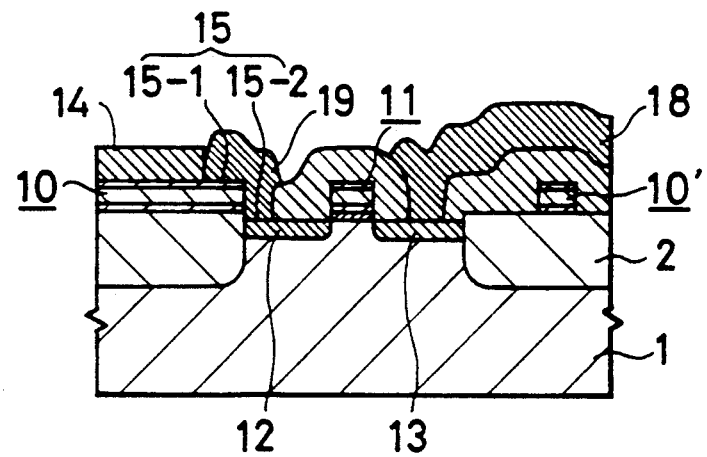

Referring to FIGS. 1(A) to 1(D), the manufacturing process of an insulated gate field effect transistor in accordance with the present invention is illustrated.

The upper portion of a silicon semiconductor substrate 1 is selectively oxidized to form a field insulating film 2. The upper surface of this structure is oxidized at a high temperature to form a silicon oxide film 3 of 200Å thickness. A very thin upper portion of the silicon oxide film 3 is provided with a 5-20 Å thick blocking film 4 of silicon nitride by a solid-vapor phase reaction between silicon and ammonia.

Then, a superconducting ceramic film 5 is deposited to a thickness of 0.2 to 2 microns, e.g. 0.5 micron, on the structure at a substrate temperature of 700° C. by sputtering in an argon oxygen atmosphere. The input power is 100 W at 50 Hz. The target composition $YBa_2CU_3O_{6-8}$. By use of this target, the composition of the deposited ceramic conforms to $YBa_2CU_3O_{6-8}$. The critical temperature is about 84K.

Next, a metallic film 6 is deposited to a thickness of 100-10000 Å on the superconducting ceramic film 5 by sputtering of Cu, Ag or Au. A $TiSi_2$ film of 0.1 to 0.5 micron thickness may be deposited further thereon if desired. Alternatively, the substrate 1 may be formed from a silicon material doped with phosphorous or boron, a non-oxidizing heat-resistant metal such as tungsten, or a metal semiconductor such as $WSi_2$. Anyway, this embodiment requires that the substrate 1 be heat-resistant.

With a photoresist mask 8 formed on the structure, a portion of the laminate consisting of the films 4, 5 and 6 is removed by etching such as plasma etching. The etchant is an acid such as sulphuric acid or hydrochloric acid. This photoresist is removed after etching.

Then, a source region 12 and a drain region 13 are formed within the silicon semiconductor substrate 1 by ion implantation followed by thermal annealing at 950° C. After cooling, the structure is subjected to supplemental annealing at 500°-600° C. for 1-2 hours as illustrated in FIG. 1(B). The supplemental annealing allows the superconducting ceramic material to form a modulated perovskite-like structure and, as a result, a high critical temperature is realized. On the substrate, there are provided superconducting leads 10 and 10' for interconnection among devices and contacts formed in or on the semiconductor substrate and a gate electrode 11 made of the multilayered superconductor.

An intervening insulating film 14 of 0.3-1.0 micron thickness is formed over the entirety of the upper surface of the structure and then selectively removed by a known photoetching in order to provide openings 15 and 16, as shown in Figure 1(C). A portion of the superconducting film 5 of the lead 10 is exposed through the opening 15 at 15-1 while a portion of the source region 12 formed within the substrate is also exposed through the opening 15 at 15-2. A portion of the drain 13 is also exposed through the opening 16.

An aluminium film of 0.3 to 1.0 micron thickness and a non-reactive metallic film such as Ag of 0.05 to 0.2 micron thickness are formed over the structure and selectively etched to form contacts 19 and 18 on the source region 12 and the drain region 13. These contacts 18 and 19 may be zero-resistant by further coating a superconducting ceramic film thereon. The material forming the contacts 18 and 19 has to be chosen from materials compatible with the semiconductor. Examples of such materials are $WSi_2$, $MoSi_2$ or Si. Metals are not suitable in general since semiconductors tend to absorb them. However, aluminum may be exceptionally used.

Figure 2A:
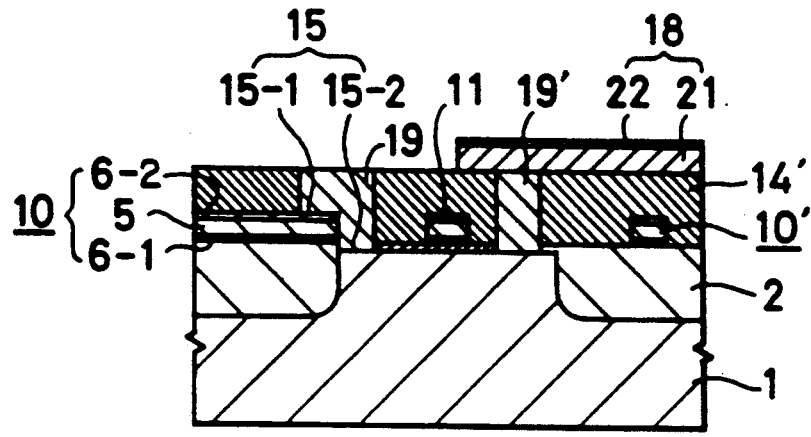
FIGS. 2(A) to 2(C) are cross sectional views showing modifications of the superconducting device in accordance with the present invention.

FIG. 2(A) shows a second embodiment of the present invention which is a modification of the foregoing embodiment. The corresponding parts are given similar reference numerals. The leads 10 and 10' and the gate electrode 11 are composed of a superconducting ceramic film 5 sandwitched between a lower metallic film 6-1 and an upper metallic film 6-2 which are compatible with the superconducting film 5. An electrode 19 is formed within an opening formed in an insulating film 14' in order to electrically connect the surface 15-1 of the upper metallic film 6-2 with the upper surface 15-2 of the semiconductor. Also, an electrode 19' is formed to contact the surface of the drain region 13 through an opening formed in the insulating film 14'. The electrodes 19 and 19' are made of tungsten by a selectively growing method. The upper portion of the electrode 19' is electrically connected to a lead 18 composed of a superconducting ceramic film 21 and a metallic film 22.

Figure 2B:
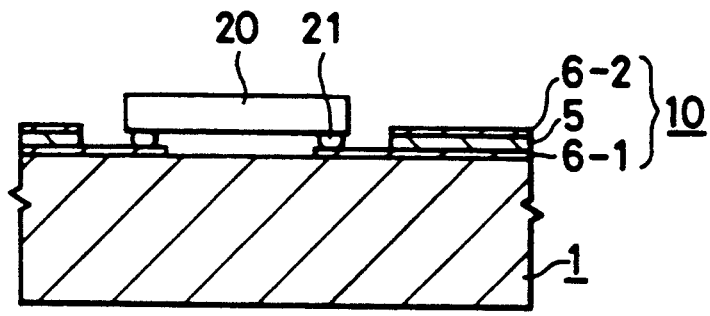

An application of such a composite superconducting lead 10 is illustrated in FIG. 2(B). A composite electrode composed of a metallic film 6-1, a superconducting ceramic film 5 and a Cu or Ag film 6-2 is formed on the surface of a heat-resistant substrate 1. The substrate 1 is made and chosen from materials whose thermal expansion coefficients are approximately equal to that of the superconducting material, such as alumina, YSZ-(yttrium stabilized zircon) or strontium titanate. The lower conductive film 6-1 extends inwardly to form contacts on which an IC chip 20 is mounted through bumps 21 in accordance with the face down method. The IC chip 20 can be mounted on the upper conductive film 6-2 as shown in FIG. 2(C)

Figure 2C:
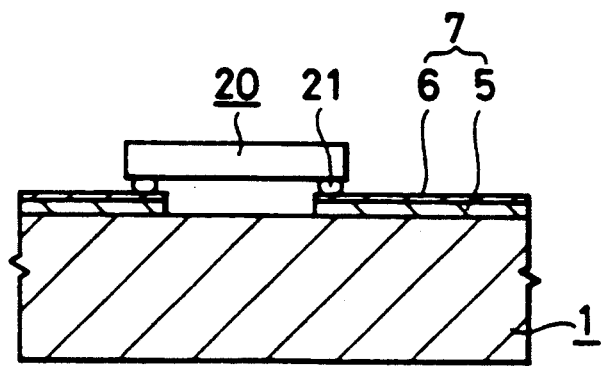

The substrate employed in the examples as shown in FIGS. 2(B) and 2(C) may be ceramic substrates, plastic substrates, print boards or the like. These superconducting patterns can be manufactured by depositing a superconducting ceramic film, forming a metallic film thereon, and selectively removing the metallic film and the superconducting film by etching using an acid with a mask. On the surface having these superconducting patterns, IC chips, transistor chips and other elements (SMC) in the forms of microchips are mounted and connected by wire bonding.

FIGS. 3(A) to 3(D) are cross section views showing another manufacturing method in accordance with the present invention. This embodiment is substantially same as the first embodiment, and therefore like numarals are given to like parts and redundant explanation will be dispensed with.

After forming a blocking film 4 of 5-20 Å thickness in the same manner as the first embodiment, a superconducting ceramic film 5 is deposited followed by annealing. Then, a conductive film 6 is formed thereon.

Figure 3:
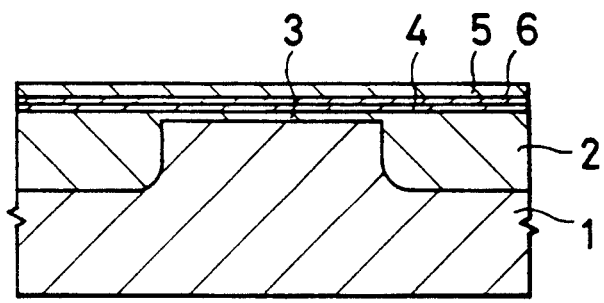
FIG. 3(A) to 3(D) are cross sectional views showing another manufacturing method of a superconducting device in accordance with the present invention.
Figure 3:
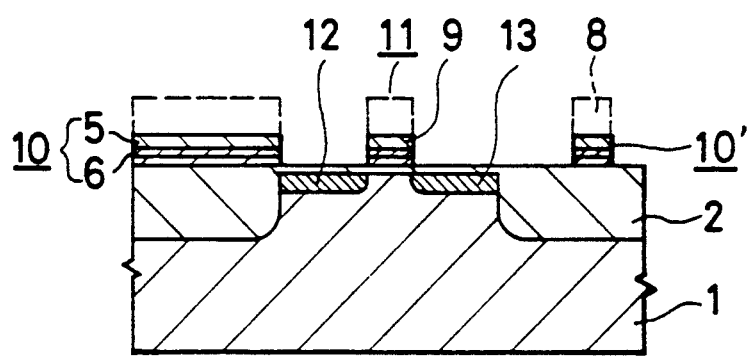
Figure 3:
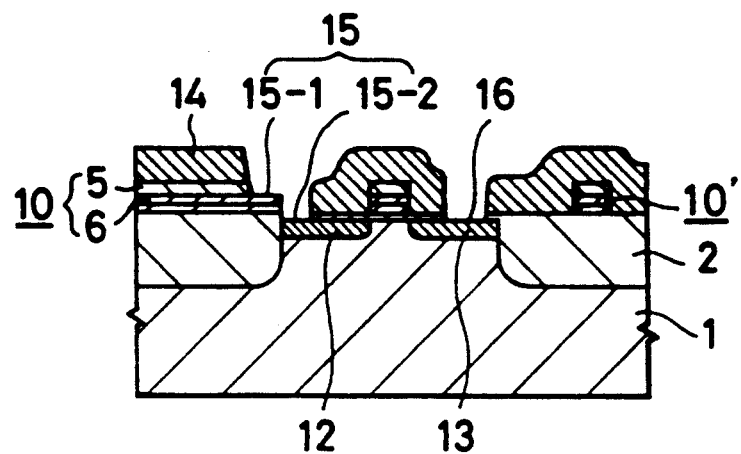
Figure 3:
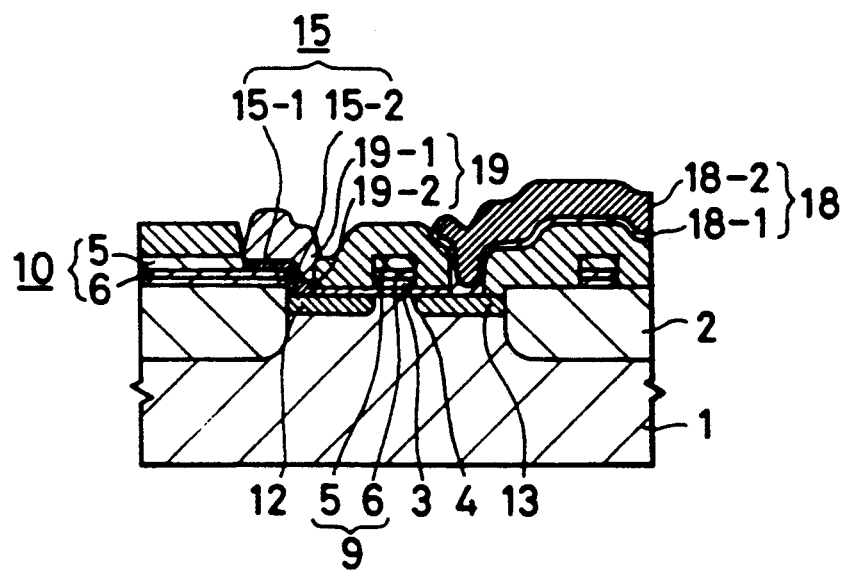

The source and drain electrodes are composed of normal conducting films 19-1 and 18-1 and superconduting films 19-2 and 18-2 as shown in FIG. 3(D). The normal conducting film is in turn a composite film composed of an aluminium film of 0.1-0.3 micron thickness and a silver film of 0.05-0.2 micron thickness formed thereon.

Other elements of this embodiment are same as the first embodiment, although not described.

Superconducting ceramics for use in accordance with the present invention also may be prepared in consistence with the stoichiometric formulae $(A_{1-x}B_x)_y CU_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and $x=0-1$; $y=2.0-4.0$, preferably 2.5-3.5; $z=1.0-4.0$, preferably 1.5-3.5; and $w=4.0-10.0$, preferably 6.0-8.0. Also, superconducting ceramics for use in accordance with the present invention may be prepared consistent with the stoichiometric formulae $(A_{1-x}B_x)_y Cu_zO_w$, where A is one or more elements of Group Vb of Periodic Table such as Bi, Sb and As, B is one or more elements of Group IIa of the Periodic Table, e.g., the alkaline earth metals including beryllium and magnesium, and $x=0.3-1$; $y=2.0-4.0$, preferably 2.5-3.5; $z=1.0-4.0$, preferably 1.5-3.5; and $w=4.0-10.0$, preferably 6.0-8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°-60° K., which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$.

Also, organic superconducting materials which have received a great deal of attention can be used for embodying the present invention.

While a description has been made for several embodiments, the present invention should be limited only by the appended claims and should not be limited by the particualr examples. For example, the present invention can be applied for VLSIs or ULSIs.

I claim:
1. An electronic device comprising:
   a semiconductor substrate;
   a semiconductor device formed within said semiconductor substrate;
   a superconductor lead formed on said substrate; and
   a connection for connecting said semiconductor device and said superconductor lead,
   wherein said connection is characterized by a double buffer layer consisting of first and second conductive layers, said first layer being in contact with said semiconductor device and comprising an element from a group including Si and Al, said second layer being in contact with said superconducting lead and comprising an element from a group including Cu, Ag and Au.

2. The electronic device of claim 1 wherein said semiconductor device is an insulated gate transistor.

3. The electronic device of claim 2 wherein the insulated gate is formed of a portion of said superconducting lead.

4. The electronic device of claim 3 wherein said superconducting lead is formed on a field insulating film.

* * * * *